Oct. 11, 1960 B. F. GRIB 2,956,242

TUNING FORK OSCILLATOR

Filed Oct. 22, 1957

INVENTOR.
BORIS F. GRIB
BY Darby & Darby
ATTORNEYS

United States Patent Office 2,956,242

Patented Oct. 11, 1960

2,956,242

TUNING FORK OSCILLATOR

Boris F. Grib, Huntington Station, N.Y., assignor to Philamon Laboratories, Inc., Long Island City, N.Y., a corporation of New York Filed Oct. 22, 1957, Ser. No. 691,624

8 Claims. (Cl. 331—156)

Figure 1:
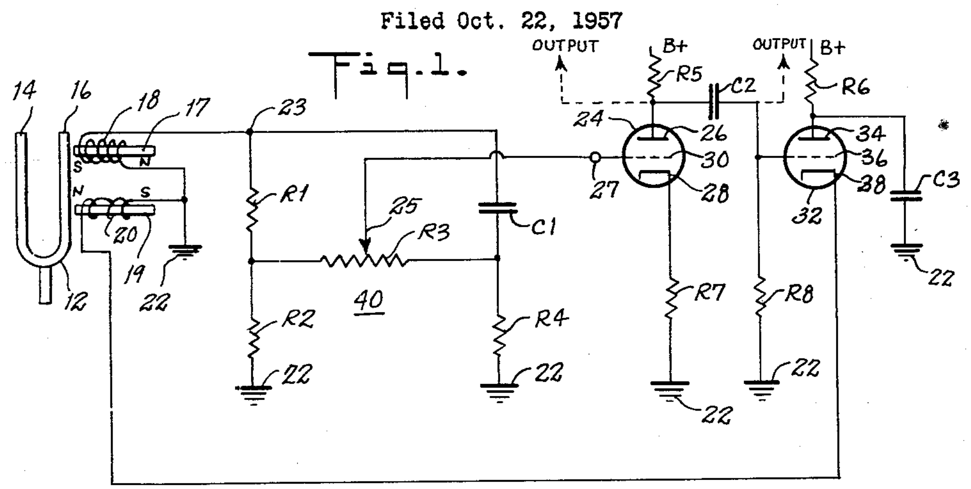

The present invention relates to an electrically driven tuning fork apparatus wherein the electrical circuit includes means for controlling the frequency of vibration of the tuning fork. More particularly the invention relates to special apparatus wherein the amplitude of the output of the tuning fork is not substantially changed by adjusting the tuning fork vibration frequency.

Electrically driven tuning forks are frequently used to provide an alternating current electrical signal having a very high degree of frequency stability. Tuning forks may be provided with various means for changing the mechanical characteristics of the fork to vary or set its resonant frequency. It is desirable however to provide additional means for making very fine adjustments in the frequency of oscillation to arrive at a very exact value and this is best done by providing some sort of adjustment in the electrical circuit for the tuning fork. The degree of fineness of adjustment required may be appreciated from the fact that the overall frequency stability of a tuning fork apparatus of this type may often be on the order of 10 to 100 parts per million over an extremely wide range of temperatures, and it is sometimes necessary to adjust a particular frequency to within one-tenth part per million.

It is possible to adjust the frequency of vibration of a tuning fork by varying the amplitude of its vibration since the frequency of vibration of a particular tuning fork depends to a slight extent upon its amplitude of vibration. This is particularly true when the tuning fork is considered in conjunction with the driving apparatus which produces damping and other effects which vary with the amplitude of vibration of the fork.

As a practical matter, however, it is not satisfactory to adjust the frequency of electrically driven tuning forks by varying the amplitude of vibration due to the fact that the amplitude of vibration will vary with changes in power supply voltage, tube aging, and other uncontrollable factors. It is therefore preferable that the amplitude of vibration not be utilized as a frequency control device, but rather that it be kept as constant as possible in order to minimize frequency variations due to change in amplitude.

It is also possible to control the frequency of vibration of an electrically driven tuning fork oscillator by varying the phase relationship in the feedback loop of the electrical drive apparatus. The relationship between the relative phase of the pickup and driver units of the driving apparatus will be explained in considerable detail at a later point. For the present it is sufficient to state that by causing the phase of the drive unit to be advanced the frequency may be increased and by causing the phase of the drive unit to be retarded the frequency may be reduced.

Heretofore apparatus utilizing this phenomenon to control tuning fork frequency have been unsatisfactory due to the fact that when the tuning fork is driven at a frequency different from its natural resonant frequency the amplitude of vibration is sharply diminished. This means that in adjusting the tuning fork frequency by a change in driver phase a wide variation in output was also produced. Since a wide range of amplitude variation is produced in the operation of such a tuning fork, the maximum amplitude must be considerably greater than if the tuning fork could be maintained at a relatively constant minimum amplitude. This has the result of enhancing the frequency-changing effect of the unavoidable slight changes in amplitude due to power supply fluctuations and the like.

It is accordingly an object of the present invention to provide a controllable-frequency, electrically-driven tuning fork oscillator wherein the output frequency is controlled by a change of phase without substantial variation in the amplitude of the output oscillations.

It is another object of the present invention to provide a controllable-frequency, electrically-driven tuning fork oscillator wherein the output frequency is stabilized by maintaining the amplitude of oscillation of the tuning fork at a relatively low and fairly constant value to minimize variations of output frequency with power supply voltage variations, circuit parameter variations, and the like.

It is a further object of the present invention to provide a controllable-frequency electrically-driven tuning fork oscillator wherein the output frequency is controlled by adjustment of a phase shifting network which simultaneously compensates for the tendency of the tuning fork amplitude of vibration to decrease when the frequency of vibration departs from the natural resonant frequency of the fork, so that more nearly uniform output can be maintained.

Figure 2:
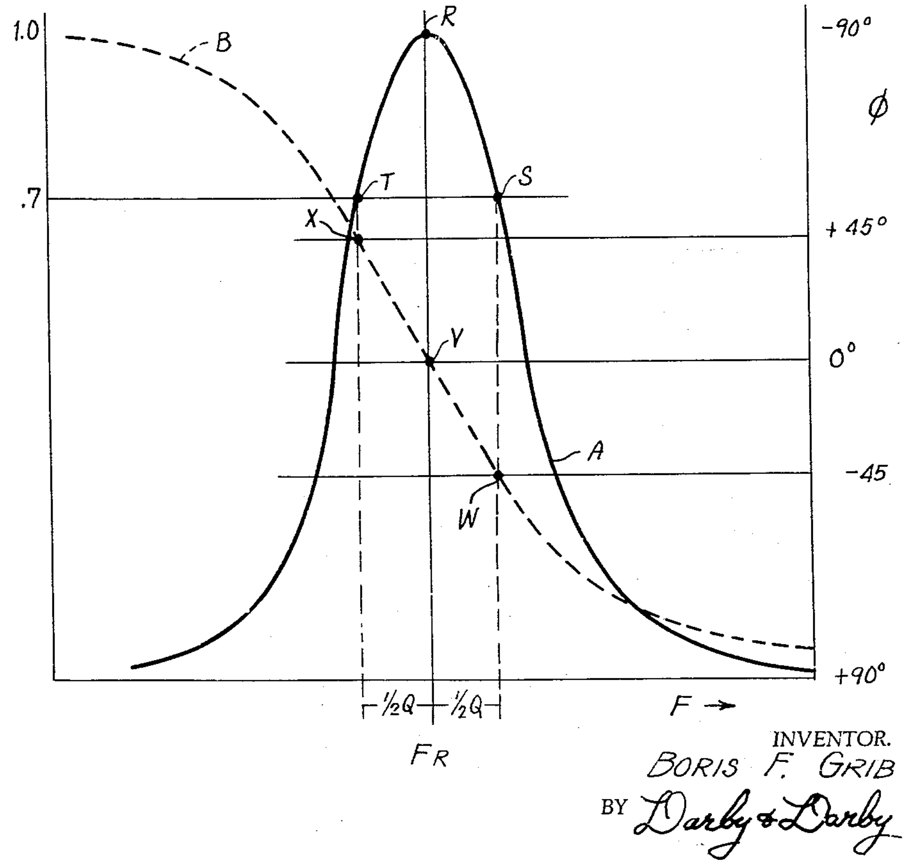

Other objects and advantages will be apparent from a consideration of the following description in conjunction with the appended drawings in which:

Fig. 1 is a schematic diagram of an electrically driven tuning fork oscillator according to the present invention, and Fig. 2 is a graph showing the frequency, amplitude, and phase relationships of a resonator such as a tuning fork in the region near its resonant frequency, presented as an aid in describing the operation and advantages of the present invention.

Referring to Fig. 1, an electro-mechanical resonator is shown at 12. The particular type of electro-mechanical resonator utilized in the present invention is not important, although a tuning fork resonator of the especially designed form shown in U.S. Patent 2,732,748, for "Tuning Forks," issued January 31, 1956, to Boris F. Grib is preferred. It will be understood that any desired form of resonant vibration element or electro-mechanical resonator, such as a reed, piezo-electric crystal, magnetostrictive element, or the like may be used.

The fork 12 has a pair of vibratory tines 14 and 16. Mounted near the end of the tine 16 is a permanent magnet 17 around which is wound a pickup coil 18. A second similar magnet 19 is also provided adjacent to tine 16 and a driving coil 20 is wound around the magnet 19. As shown in the drawing, magnet 17 has one pole, such as its south pole, adjacent tine 16, while magnet 19 has its opposite pole (i.e. north pole) adjacent tine 16.

As the tine 16 vibrates, it will cause a variation in magnetic flux to be produced within the coil 18 due to the variation of width of the air gap between the tine 16 and the magnet 17. The variation in magnetic flux will induce an electromotive force in the pickup coil 18.

The driver coil 20 operates to cause oscillation of tine 16 when an alternating current of proper frequency is supplied to coil 20. The oscillatory vibration of tine 16 is created simply by the periodic attraction of tine 16 (of magnetic material) by the magnetic flux generated by coil 20.

In Fig. 1 only one drive coil 20 has been shown so that tine 14 vibrates solely by sympathetic vibration. Obviously a driver coil could be placed adjacent tine 14 and if desired a second pickup coil similar to 18 could also be placed on the other side of fork 12 adjacent tine 14.

For the purpose of the present invention it is immaterial what type of drive coil and pickup devices are utilized in conjunction with the vibrator, so long as they are appropriate to perform those functions with the vibrator. For example, it is not even necessary that the pickup be of the magnetic type; a sound sensing or photoelectric pickup might equally well be used in conjunction with the present invention. It will be understood that the arrangement of fork, magnets and coils, forming a fork resonator, is shown only schematically and many suitable physical arrangements are possible.

The output of the pickup coil 18 is connected to an adjustable phase-shift network designated 40. The network 40 has the particular characteristic that the attenuation produced by the network varies inversely with the phase shift imparted by the network. To state this characteristic in other terms, with a constant input signal amplitude, the output signal amplitude increases with increasing phase shifts. Previous known variable phase-shift networks frequently employ a circuit arrangement in which the maximum output voltage is obtained for zero degrees of phase shift. The network shown by way of illustration in Fig. 1 is designed to have an opposite characteristic to the characteristic of commonly utilized networks described above. That is, in the network shown in Fig. 1, the output has a minimum amplitude for zero phase shift and increases to a value approximately 1.4 times the minimum value for the maximum phase shift which is approximately 45°. By this means, a tuning fork type oscillator of improved accuracy and output stability is provided for reasons which will be explained now with reference to Fig. 2.

In Fig. 2, the full-line curve illustrates a typical resonance curve A, characteristic of tuning forks and other resonant devices. The ordinate of the graph applicable to curve A is numbered on the left-hand side of the graph and represents the output voltage for a constant input current or excitation. Frequency of oscillation is represented as the abscissa of the graph of Fig. 2. The frequency is normalized about the point $F_R$ which is the natural resonant frequency of the tuning fork. At a distance of ½ Q on either side of the resonance point R are located the half-power points S and T of the resonance curve A. The amplitude of oscillation at the half-power points T and S is approximately .7 of the maximum resonance amplitude at R.

Curve A of Fig. 2 illustrates the fact that a given driving force applied to a tuning fork or other resonator which produces an amplitude of one unit at the resonant frequency will produce an amplitude of approximately .7 of one unit where the tuning fork is driven at a frequency equal to $(1+\frac{1}{2}Q)$ times its resonant frequency.

When a resonator is driven at other than its resonant frequency, its output voltage is out of phase with the driving oscillation. Dotted curve B in Fig. 2 illustrates the phase difference between the driving force or current and the output voltage of the tuning fork resonator.

Obviously, at the resonant frequency $F_R$ the tuning fork will vibrate with no phase difference between the driving force and the output voltage of the fork, as indicated by point V on curve B. It can be demonstrated that a phase difference of −45° between driving force and output voltage is produced by a frequency shift in the positive direction in an amount equal to ½Q. This is indicated at point W on curve B. In like manner the output leads the input by 45° upon a reduction of frequency by an amount equal to ½Q as indicated at point X.

From the curves of Fig. 2 it will be seen that a phase change of 45° in the driving force applied to the tuning fork corresponds to a shift in driving frequency from the resonant frequency by an amount equal to ½Q. Also, this frequency shift results in a reduction of amplitude of the tuning fork output to .7 of its value at resonance, assuming that the driving force remains constant in amplitude.

In the foregoing explanation no mention has been made of the source of driving force, and the characteristics described are those of the resonator. By regeneratively coupling the pickup coil to the driving coil, with suitable amplification, self-sustained oscillations are obtained. The resonator, however, must fulfill the phase and frequency relation just described, and accordingly the system will oscillate stably only at the particular frequency at which the proper phase relations exist for regeneration, namely that frequency for which the resonator phase difference plus the phase shift produced in the circuit equals 360° or a multiple thereof. Therefore by adjusting the circuit phase shift, it is possible to vary the oscillatory frequency relative to the resonant frequency, with a corresponding change in relation between driving force amplitude and resonator output amplitude.

From the foregoing explanation it will be observed that if the phase-shifting device utilized to control the frequency of a tuning fork oscillator were provided with a constant attenuation for all values of phase shift it produces, a variation in the output of the tuning fork from approximately maximum value to .7 maximum value would be produced for a phase shift in the phase-controlling device of 45° from the resonant condition.

High amplitudes for the tuning fork oscillation are undesirable due to the fact that as the resistance values, power supply voltage, tube, and other parameters of the circuit experience unwanted changes due to external influences, the amplitude of oscillation will be affected by a percentage of its total value in proportion to the amount of change of parameter value. Since the amplitude is affected by external influences percentagewise, the lower the amplitude is maintained, the less change in amplitude will be experienced under a given set of operating conditions. As previously pointed out, amplitude changes produce frequency deviations. Hence, desirably the drive for the fork is kept suitably low so that the amplitude of the tuning fork may be kept at a low value, whereby variations of amplitude and hence of frequency due to external influences are reduced, and the frequency stability of the system is enhanced.

In systems of the present type it is desirable that the output voltage shall remain constant despite adjustments in frequency. However, as indicated above, adjustments in frequency away from resonance are accompanied by a reduction in output from the fork, by as much as 30% for a phase shift of 45°. For a high-Q resonator having a Q of the order of 10,000, this shifts the frequency by ½Q or but 50 parts per million, so that even minor changes in frequency cause considerable changes in output. Previous tuning fork frequency controls did not alleviate this problem and in fact in some cases the phase control device had an output-phase characteristic which not only failed to compensate for the above described effect but in fact caused even further decrease in output amplitude as the frequency of the tuning fork departed from resonance.

The phase-shift network 40 shown in Fig. 1, has an attenuation-phase shift characteristic which substantially compensates for the tendency of the tuning fork amplitude of vibration to decrease for frequencies off resonance. The network 40 has a first branch comprising resistors R–1 and R–2 connected in series from the input terminal 23 of the network to ground terminal 22. A second branch of the network 40 comprises capacitor C–1 and resistor R–4 connected in series, this branch also being connected between input terminal 23 and to ground terminal 22, in parallel with the first branch R–1, R–2. A potentiometer R–3 has its end terminals connected respectively to the junction of resistors R–1 and R–2 and the junction of capacitor C–1 and resistor R–4. The output from network 40 is taken off between the sliding tap 25 of potentiometer R–3 and ground 22.

When tap 25 is moved to its extreme left position in Fig. 1, the output terminal 27 to which it is connected is effectively connected to the junction of resistors R–1 and R–2. The resistance of potentiometer R–3 is substantially greater than the resistance values of the other elements R–1, R–2, R–3 and the reactance of C–1. Therefore the first branch of the network comprising resistors R–1 and R–2 may be considered to be effectively isolated from the second branch comprising capacitor C–1 and resistor R–4. The first branch comprising resistors R–1 and R–2 is purely resistive and thus with the tap 25 moved to its extreme leftward position, the phase shift at output terminal 27 relative to input terminal 23 is 0°.

Considering now the second branch of the network comprising capacitor C–1 and resistor R–4, it will be noted that capacitor C–1 is a substantially pure capacitive reactance while the resistor R–4 is substantially purely resistive. The voltages across these two elements are therefore separated in phase by 90°. The voltage across C–1 and the voltage across R–4 added in phase quadrature are equal to the input voltage applied between terminal 23 and ground terminal 22.

For the purpose of illustration, the capacitance of capacitor C–1 may be selected to provide a capacitive reactance at the tuning fork resonant frequency which is substantially equal to the resistance of resistor R–4. In one simple practical embodiment of the network 40, resistors R–1, R–2, and R–4 are of a resistance value of 100K ohms. The capacitance of C–1 is selected to give a reactance at the fork resonant frequency also equal to 100K ohms. The resistance value of potentiometer R–3 is preferably substantially higher, for example, 500K ohms.

Where the impedances of capacitor C–1 and resistor R–4 are equal, the voltage across capacitor C–1 will lag the input signal voltage by 45° while the voltage across resistor R–4 will lead by 45° and the magnitude of the signal across each of these elements will be .7 of the magnitude of the input signal. Therefore if the sliding tap 25 is moved to the right extremity of potentiometer R–3, the output voltage at terminal 27 will have a phase value of +45° and a magnitude of .7 of the input signal. Obviously, in the example given, the output signal when the tap 25 is moved to the left is one-half of the input signal. Therefore network 40 provides an output versus phase characteristic wherein the magnitude of the output signal increases for increasing shifts in phase and where the minimum output signal at zero phase shift is approximately .7 of the maximum output signal at +45° shift in phase.

The output from the phase shift network 40 at terminal 27 is connected to the grid 30 of an amplifier tube 24. The amplifier tube 24 is shown as a triode having a plate 26, a control grid 30 and a cathode 28. The present invention is not limited to the particular type of amplifier devices shown, and tetrode or pentode amplifier tubes or other amplifier devices such as magnetic amplifiers, transistors, or the like might be used.

The triode 24 has its plate 26 connected through a plate resistor R–5 to a suitable plate power supply indicated at B+. Cathode 28 of the tube 24 is connected through cathode resistor R–7 to ground terminal 22. The plate 26 is also connected through coupling capacitor C–2 to the input of a second amplifier stage comprising triode tube 32. The grid 36 of tube 32 is supplied with a grid resistor R–8 connected between grid 36 and ground terminal 22. The plate 34 of tube 32 is connected through resistor R–6 to the B+ power supply. The cathode 38 of tube 32 is connected through driver coil 20 to ground terminal 22. The cathode current from tube 32 flowing through coil 20 therefore drives the tuning fork 12. Instead of being returned to ground 22, the lower potential end of drive coil 20 may be returned to the cathode 28 of tube 24.

In the operation of the circuit of Fig. 1, any random fluctuations in the circuit or fork will start the system. Any motion of the tuning fork tine 16 will cause a variation in the air gap between tine 16 and magnet 17, thus causing variation in the magnetic flux in coil 18. An electrical potential is thus generated in coil 18 which is supplied to input terminal 23 of phase-shift network 40. If the sliding tap 25 of potentiometer R–3 is at its extreme leftward position, no phase shift will be imparted by network 40. The voltage from pickup coil 18 will therefore be supplied at output terminal 27 in phase but diminished in amplitude by 50%. The signal at terminal 27 will be amplified by the two-stage amplifier comprising tubes 24 and 34, and the output from the cathode 28 of the second tube 32 is supplied to driver coil 20.

A capacitor C–3 may be connected between plate 34 and ground terminal 22 to sharpen the output pulses from tube 32. When grid 36 is negative, the current in tube 32 is substantially blocked so that capacitor C–3 charges to substantially the full B+ voltage. As grid 36 goes positive and tube 32 draws current, the voltage at plate 34 would, normally, be diminished by reason of the voltage drop across resistor R–6. The charge on capacitor C–3 reduces this plate voltage drop and the discharge current from capacitor C–3 increases the current flow through tube 32 on the current pulses. Conversely, when grid 36 is negative, capacitor C–3 draws current which increases the voltage drop across resistor R–6 and thus tends to cut off tube 32 more sharply. This arrangement provides an essentially constant excitation or drive for drive coil 20, independent of any variations in input to tube 24, within the limits of operation of the apparatus.

As an illustration of the circuit component values which may be used, R–5 may be 150K ohms, R–7, 2000 ohms, C–2, .01 microfarad, R–6, 2.0 megohms, R–8, 1.0 megohm and C–3, 1.0 microfarad. A grid current limiting resistor of about 300K ohms may be inserted in series between the junction of C–2 and R–8, and the grid of tube 34. Tube 24 may be a 12AT7, with a gain of about 20, operated with a plate supply of about 350 volts. Output is derived from the plate of tube 24 or from C–2 of the order of 2 volts in amplitude, which may be suitably amplified as desired.

In the case where no phase shift is imparted by network 40, the force applied to tine 16 by drive coil 20, if in phase with the vibration of tine 16, by virtue of the amplification provided by the closed loop of the circuit, will cause the vibration of tine 16 to build up to an amplitude at which energy losses due to damping and the like are supplied by the amplification of the circuit and a steady state of vibration is reached.

It should be noted that there is substantially no total phase shift introduced by the amplifier and driver portions of the closed loop in Fig. 1. The phase-shift network shown in Fig. 1 is designed for a feedback loop without other substantial phase shift. In the event phase shift is introduced by the remainder of the feedback loop the attenuation characteristic of the network should be adjusted accordingly, since the maximum attenuation should occur for zero phase shift in the feedback loop taken in its entirety. Adjustment for phase shift in the amplifier and drive coil could be made by inserting an opposite, compensating phase shift element, or alternatively, the attenuation characteristic of the network could be changed to take into account the total phase shift in the feedback loop so that maximum attenuation would occur at zero total phase shift.

As previously pointed out in connection with Fig. 2, where the drive force applied to tuning fork 12 is in phase with the vibration of the fork, the fork will vibrate at its natural resonant frequency. However, by imparting a phase shift in the closed circuit loop such as by moving the tap 25 to the right on potentiometer R–3, the oscillatory frequency of tuning fork 16 will be changed from the natural resonant frequency. At the same time, the oscillator output is kept substantially uniform. For example, at resonance (with tap 25 to the extreme left), the fork output amplitude may be taken to be 2 units large. Then the output of network 40 will be 1. If the frequency is shifted by moving tap 25 to the extreme right, the fork output drops to .7 of 2 units, or 1.4. However, at the same time the attenuation of circuit 40 is 0.7, so that the resultant output is $1.4 \times 0.7$ or 1.0. Hence the same output amplitude is maintained. Between these extremes, the output will vary no more than 5 to 8%, as contrasted with over 50% variation with a simple R-C phase-shift circuit.

The circuit of Fig. 1 provides an advance in phase by movement of the tap 25 to the right in Fig. 1. An advance in phase creates an increase in frequency. The circuit could of course be designed to operate in the opposite fashion, that is, by providing a phase-lag network, in which case a decrease from the resonant frequency would be provided. A phase-lag network could be provided, for example, by substituting an inductance for the capacitor C–1 shown in Fig. 1. Alternatively the network of Fig. 1 could be changed to a phase-lag network by reversing the positions of capacitor C–1 and resistor R–4 in Fig. 1. Other modifications could also be devised to provide a phase-lag network.

For practical purposes it is preferred that the circuit shown by providing an advance in phase be used due to the fact that such an arrangement produces a device in which the vibration of the tuning fork is more easily initiated. The phase-shift network of Fig. 1 is arranged to have an inherent phase-shift versus attenuation characteristic of the desired type. It is obvious that a phase-shift device having an unsuitable attenuation characteristic could be adapted to provide the proper phase-shift versus attenuation characteristic by adding a potentiometer (or other separate attenuator) with an appropriately designed resistance characteristic, and by ganging the potentiometer control to the control of the phase-shift device. The combined attenuation characteristic of the two devices could then be made such that the amplitude-frequency characteristic of the tuning fork would be properly compensated.

As was previously explained in detail, the circuit of Fig. 1 has the particular advantage that the variation of output with frequency (for a constant driving force) as shown by curve A in Fig. 2 is compensated by varying the loop gain by the same phase-shift network which produced the frequency change.

Obviously the phase-shift network 40 or its equivalent need not be placed immediately following the pick-up coil 18 as shown in Fig. 1, but could be placed at any point in the circuit loop. Some advantage is achieved by placing the phase shift network at a place where the signal current is lowest since the required size of the components of the network is thereby minimized and unavoidable energy losses in the phase-shift network may be kept at a minimum.

The system of the present invention provides a desirable constant current drive for the fork resonator, which eliminates any significant effect of driving coil inductance. Otherwise, if voltage drive is used, any variation in driving coil inductance, due to temperature or permeability drift will cause a shift in phase. Such uncontrolled phase shifts are undesirable, since each degree of phase shift will produce a frequency change of $$\frac{10000}{Q}$$

parts per million (p.p.m.).

An important feature of the present invention resides in maintaining a low amplitude of oscillation of the fork, which minimizes variations in output frequency due to unavoidable circuit and component parameter changes. The present invention is particularly useful in very high accuracy stable oscillators, where the output frequency may not vary more than 10 to 100 p.p.m. over the entire range of conditions experienced. In such oscillators, it has been discovered that changes in drive level will vary the frequency of oscillation, an effect believed due to the damping effect of the permanent magnets 17, 19 which effectively add mass to the fork and hold back the vibrations of the tines.

By way of explanation, the expected variation in some circuit parameters (such as B+ voltage) may produce X% variation in drive amplitude. For a large drive amplitude, the magnitude of drive variations is X% of that large amplitude, and will produce a given change $\Delta f$ in frequency, roughly proportional to the magnitude of drive change. However, with a small drive amplitude, X% thereof will provide only a small $\Delta f$, so that the system is rendered relatively immune to parameter changes, from whatever cause, by the choice of small drive amplitude.

From the foregoing description and explanation it may be seen that an electrically driven tuning fork oscillator with frequency control is provided wherein the amplitude of vibration of the tuning fork may be maintained at a low value, so that the frequency stability of such a device is substantially improved in the presence of practically unavoidable power supply voltage fluctuations and other external influences.

The present invention therefore permits high accuracy and high stability oscillators to be provided, with frequency variations of the order of 100 p.p.m. or less over their operating range. Within that range, a particular frequency may be selected by the vernier-type action of the phase-shift network 40, which at representative Q values of 10,000, can vary frequency by as much as 45 p.p.m. and set a particular frequency within $\frac{1}{10}$ p.p.m. while maintaining substantially uniform output amplitude.

Various modifications of the embodiment of the present invention shown have been suggested. These and many other modifications to the embodiments shown and described may be made by a person of ordinary skill in the art within the scope of the present invention. The scope of the present invention is therefore not to be construed to be limited to the particular embodiments shown and described but is defined solely by the appended claims.

What is claimed is:

1. An electrically driven mechanical resonator apparatus comprising a tuned vibrator, a drive coil for causing said vibrator to vibrate, a pickup adjacent said vibrator, a phase-shift network connected to receive the output of said pickup, said network comprising a pair of resistors connected in series with the output of said pickup, a capacitor and further resistor connected in series with the output of said pickup in parallel with said pair of resistors, a potentiometer having a sliding tap and having its end terminals connected respectively to the junction of said pair of resistors and the junction of said capacitor and further resistor, and output terminals for said network connected respectively to said sliding tap and one ouput terminal of said pickup coil, an amplifier connected to the output terminals of said network and means for connecting the output of said amplifier to supply a signal to said drive coil.

2. An electrically driven mechanical resonator apparatus comprising a tuning fork, a drive coil for causing said fork to vibrate, a pickup coil adjacent a tine of said tuning fork, a source of magnetic flux for said pickup coil, a phase-shift network connected to the output of said pickup coil, said network comprising a pair of resistors connected in series across the output of said pickup coil, a capacitor and resistor connected in series across the output of said pickup coil in parallel with said pair of resistors, a potentiometer having a sliding tap and having its end terminals connected respectively to the junction of said pair of resistors and the junction of said capacitor and resistor, and output terminal for said network connected respectively to said sliding tap and one output terminal of said pickup coil, an amplifier connected to the output terminals of said network and means for connecting the output of said amplifier to supply a signal to said drive coil.

3. An electrically driven mechanical resonator apparatus comprising a tuned vibrator, a drive coil for causing said vibrator to vibrate, a pickup adjacent said vibrator, a phase-shift network connected to the output of said pickup, said network comprising a pair of resistors connected in series across the output of said pickup, a capacitor and resistor connected in series across the output of said pickup in parallel with said pair of resistors, the impedances of each of said resistors and capacitor being substantially equal at the frequency of said tuning fork, a potentiometer having a sliding tap and having its end terminals connected respectively to the junction of said pair of resistors and the junction of said capacitor and resistor, and output terminals for said network connected respectively to said sliding tap and one output terminal of said pickup coil, an amplifier connected to the output terminals of said network and means for connecting the output of said amplifier to supply a signal to said drive coil.

4. An electrically driven mechanical resonator apparatus comprising a tuning fork, a drive coil for causing said fork to vibrate, a pickup coil adjacent a tine of said tuning fork, a source of magnetic flux for said pickup coil, a phase-shift network connected to the output of said pickup coil, said network comprising a pair of resistors connected in series across the output of said pickup coil, a capacitor and further resistor connected in series across the output of said pickup coil and in parallel with said pair of resistors, the impedances of each of said resistors and capacitor being substantially equal at the frequency of said tuning fork, a potentiometer having a sliding tap and having its end terminals connected respectively to the junction of said pair of resistors and the junction of said capacitor and further resistor, and output terminals for said network connected respectively to said sliding tap and one output terminal of said pickup coil, an amplifier connected to the output terminals of said network and means for connecting the output of said amplifier to supply a signal to said drive coil.

5. An electrically driven mechanical resonator apparatus comprising a tuning fork, a drive coil for causing said fork to vibrate, a pickup coil adjacent a tine of said tuning fork, a source of magnetic flux for said pickup coil, a phase-shift network connected to the output of said pickup coil, said network comprising a pair of resistors connected in series across the output of said pickup coil, a capacitor and further resistor connected in series across the output of said pickup coil and in parallel with said pair of resistors, the impedances of each of said resistors and capacitor being substantially equal at the frequency of said tuning fork, a potentiometer having a sliding tap and having its end terminals connected respectively to the junction of said pair of resistors and the junction of said capacitor and further resistor, said potentiometer having a total resistance substantially greater than the respective impedances of said resistors and capacitor to substantially isolate said junctions from one another, and output terminals for said network connected respectively to said sliding tap and one output terminal of said pickup coil, an amplifier having a constant amplitude output connected to the output terminals of said network and means for connecting the output of said amplifier to supply a signal to said drive coil.

6. In an electrically driven mechanical resonator apparatus including a tuned vibrator, a drive coil for causing said vibrator to vibrate, a pickup adjacent said vibrator, and an amplifier connected to supply a signal to said drive coil, the combination of a phase-shift network connected to receive the output of said pickup and comprising a resistance element connected to receive the output of said pickup, a capacitor and further resistance element connected in series with each other and in parallel with the first said resistance element, a potentiometer having a sliding tap and having its end terminals connected respectively to a point on the first said resistance element and to the junction of said capacitor and further resistance element, and output terminals for said network connected respectively to said sliding tap and one output terminal of said pickup coil, said output terminals being connected to supply a signal to said amplifier.

7. In an electrically driven mechanical resonator apparatus including a tuned vibrator, a drive coil for causing said vibrator to vibrate, a pickup adjacent said vibrator, and an amplifier connected to supply a signal to said drive coil, the combination of a phase-shift network connected to the output of said pickup and comprising a resistance element connected across the output of said pickup, a capacitor and further resistance element connected in series across the output of said pickup in parallel with the first said resistance element, a potentiometer having a sliding tap and having its end terminals connected respectively to a point on the first said resistance element and to the junction of said capacitor and further resistance element, said potentiometer having a total resistance substantially greater than the respective impedances of said resistors and capacitor, and output terminals for said network connected respectively to said sliding tap and one output terminal of said pickup coil, said output terminals being connected to the input of said amplifier to supply a signal to said amplifier.

8. In an electrically driven mechanical resonator apparatus including a tuned vibrator, a drive coil for causing said vibrator to vibrate, a pickup adjacent said vibrator, and an amplifier connected to supply a signal to said drive coil, the combination of a phase-shift network connected to the output of said pickup and comprising a resistance element connected across the output of said pickup, a capacitor and further resistance element connected in series across the output of said pickup in parallel with the first said resistance element, the impedances of said capacitor and said further resistance element being substantially equal at the frequency supplied to said network, a potentiometer having a sliding tap and having its end terminals connected respectively to a point on the first said resistance element and to the junction of said capacitor and further resistance element, and output terminals for said network connected respectively to said sliding tap an done output terminal of said pickup coil, said output terminals being connected to the input of said amplifier to supply a signal to said amplifier.

References Cited in the file of this patent

UNITED STATES PATENTS

| | | |
|---|---|---|
| 1,946,274 | Chireix | Feb. 6, 1934 |
| 2,147,492 | Mead | Feb. 14, 1939 |
| 2,300,271 | Whitaker | Oct. 27, 1942 |
| 2,346,984 | Mead | Apr. 18, 1944 |
| 2,374,000 | Crosby | Apr. 17, 1945 |
| 2,411,423 | Guptill | Nov. 19, 1946 |
| 2,414,475 | Marchand | Jan. 21, 1947 |